(12) United States Patent
Freeman et al.

(10) Patent No.: US 7,442,595 B2
(45) Date of Patent: Oct. 28, 2008

(54) BIPOLAR TRANSISTOR WITH COLLECTOR HAVING AN EPITAXIAL SI:C REGION

(75) Inventors: Gregory G. Freeman, Hopewell Junction, NY (US); Marwan H. Khater, Poughkeepsie, NY (US); Rajendran Krishnasamy, Essex Junction, NY (US); Kathryn T. Schonenberg, Wappingers Falls, NY (US); Andreas D. Stricker, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 236 days.

(21) Appl. No.: 11/511,047

(22) Filed: Aug. 28, 2006

(65) Prior Publication Data

US 2006/0289852 A1    Dec. 28, 2006

Related U.S. Application Data

(62) Division of application No. 10/905,510, filed on Jan. 7, 2005, now Pat. No. 7,170,083.

(51) Int. Cl.
*H01L 21/337* (2006.01)
(52) U.S. Cl. ............................ 438/189; 257/E27.053
(58) Field of Classification Search ............... 438/189, 438/202, 203, 204; 257/E27.053, E27.074, 257/E27.046
See application file for complete search history.

(56) References Cited

U.S. PATENT DOCUMENTS 5,233,215 A      8/1993   Baliga et al.
6,410,396 B1 *   6/2002   Casady et al. ............... 438/312
6,534,371 B2 *   3/2003   Coolbaugh et al. .......... 438/312
6,989,557 B2 *   1/2006   Chen ........................... 257/197
7,180,159 B2 *   2/2007   Howard ....................... 257/588
2004/0065875 A1* 4/2004   Ohnishi et al. ............... 257/19
2005/0167652 A1* 8/2005   Hoffmann et al. ............ 257/18
2006/0011943 A1* 1/2006   Howard ....................... 257/197

OTHER PUBLICATIONS

Osten, et al., "Carbon Doped SiGe Heterojunction Bipolar Transistors for High Frequency Applications", Institute for Semiconductor Physics, pp. 109-116, IEE 1999.

* cited by examiner

*Primary Examiner*—Thao P. Le
(74) *Attorney, Agent, or Firm*—Scully, Scott, Murphy & Presser, P.C.; Richard M. Kotulak, Esq.

(57) ABSTRACT

A structure and method where C is incorporated into the collector region of a heterojunction bipolar device by a method which does not include C ion implantation are provided. In the present invention, C is incorporated into the collector by epitaxy in a perimeter trench etched into the collector region to better control the carbon profile and location. The trench is formed by etching the collector region using the trench isolation regions and a patterned layer over the center part of the collector as masks. Then, Si:C is grown using selective epitaxy inside the trench to form a Si:C region with sharp and well-defined edges. The depth, width and C content can be optimized to control and tailor the collector implant diffusion and to reduce the perimeter component of parasitic $C_{CB}$.

12 Claims, 5 Drawing Sheets

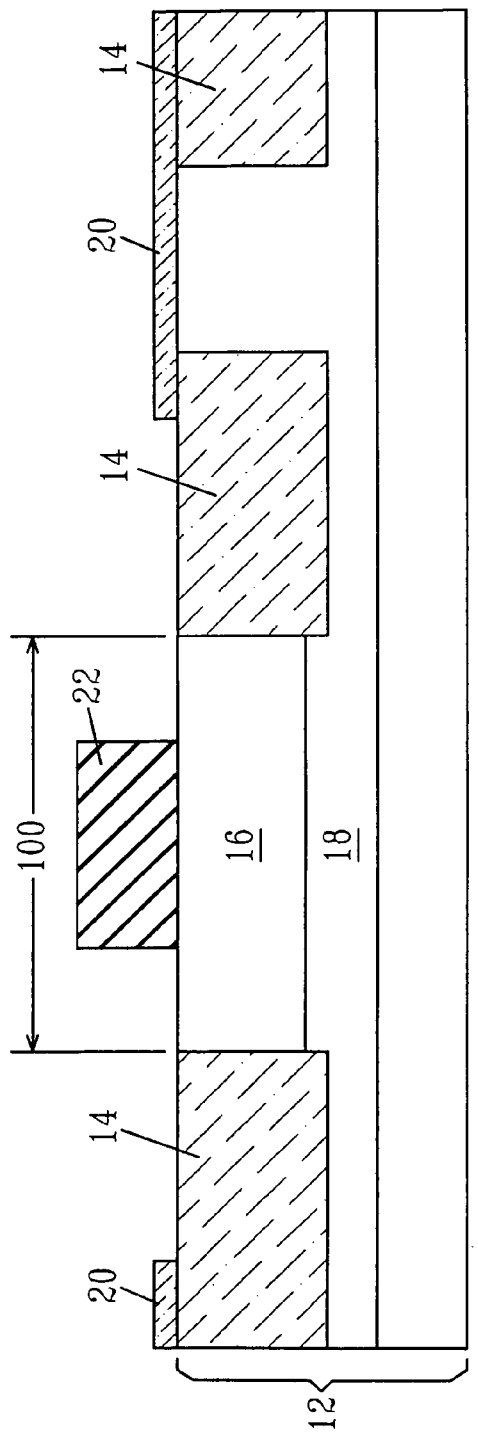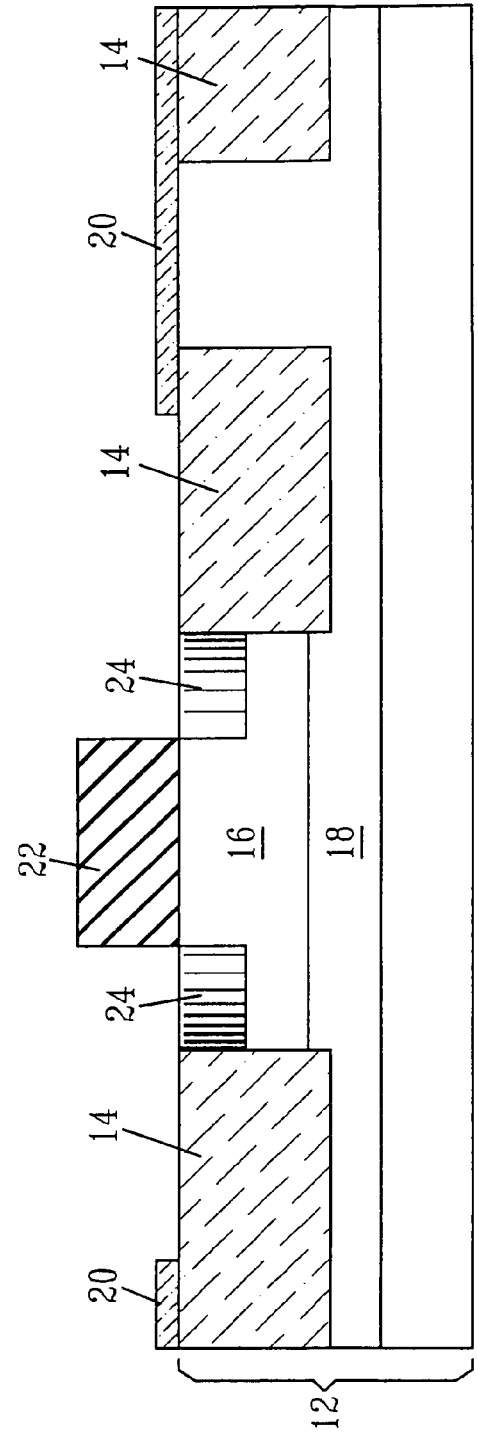

BIPOLAR TRANSISTOR WITH COLLECTOR HAVING AN EPITAXIAL SI:C REGION

RELATED APPLICATIONS

This application is a divisional of U.S. patent application Ser. No. 10/905,510, filed Jan. 7, 2005 now U.S. Pat. No. 7,170,083.

FIELD OF THE INVENTION

The present invention relates to a bipolar transistor and, more particularly to a bipolar transistor including a collector that has an epitaxial Si:C region. The presence of the epitaxial Si:C region in the collector provides improved device performance. The present invention is also related to a method of fabricating a bipolar structure having an epitaxial Si:C region which is confined within a recess that is formed into an upper portion of the collector.

BACKGROUND OF THE INVENTION

Bipolar transistors are devices with two p-n junctions that are in close proximity to each other. A typical bipolar transistor has three device regions: an emitter, a collector, and a base disposed between the emitter and the collector. Ideally, the two p-n junctions, i.e., the emitter-base and collector-base junctions, are in a single layer of semiconductor material separated by a specific distance. Modulation of the current flow in one p-n junction by changing the bias of the nearby junction is called "bipolar-transistor action."

If the emitter and collector are doped n-type and the base is doped p-type, the device is an "npn" transistor. Alternatively, if the opposite doping configuration is used, the device is a "pnp" transistor. Because the mobility of minority carriers, i.e., electrons, in the base region of npn transistors is higher than that of holes in the base of pnp transistors, higher-frequency operation and higher-speed performances can be obtained with npn transistor devices. Therefore, npn transistors comprise the majority of bipolar transistors used to build integrated circuits.

As the vertical dimensions of the bipolar transistor are scaled more and more, serious device operational limitations have been encountered. One actively studied approach to overcome these limitations is to build transistors with emitter materials whose band gaps are larger than the band gaps of the material used in the base. Such structures are called heterojunction transistors.

Heterostructures comprising heterojunctions can be used for both majority carrier and minority carrier devices. Among majority carrier devices, heterojunction bipolar transistors (HBTs) in which the emitter is formed of silicon (Si) and the base of a silicon-germanium (SiGe) alloy have recently been developed. The SiGe alloy (often expressed simply as silicon-germanium) is narrower in band gap than silicon.

The maximum oscillation frequency ($f_{max}$) of a HBT is limited by the device parasitics. More specifically, the lateral out-diffusion of collector dopant implant increases the perimeter parasitic component of the collector-to-base capacitance ($C_{CB}$) near the trench isolation edge. This increase in $C_{CB}$ limits $f_{max}$ of the HBT.

One approach to suppress the lateral diffusion of phosphorus and other like dopants is to incorporate carbon, C into the collector region. Specifically, C has been shown to suppress boron in the SiGe extrinsic base (See, for example, H. J. Osten, et al., "Carbon doped SiGe Heterojunction Bipolar Transistor for High Frequency Applications", IEEE/BCTM, 1999, p. 169). Similarly, carbon can be incorporated in the collector to suppress the lateral diffusion of phosphorus.

U.S. Pat. No. 6,534,371 B1 to Coolbaugh, et al. describes a method in which carbon is incorporated into various regions (or parts) of a SiGe bipolar device to control or prevent bipolar shorts between the emitter, base and collector.

Despite the advancements made in the prior art mentioned above, there is still a need for providing a bipolar structure wherein the lateral out-diffusion of dopants, such as n-type dopants or p-type dopants, from the intrinsic device towards its perimeter is suppressed. The suppression of such dopant diffusion is critical for reducing the perimeter parasitic component of $C_{CB}$.

SUMMARY OF THE INVENTION

The present invention provides a structure where C is incorporated into the collector of a bipolar device by a method which does not include C ion implantation. In the present invention, C is incorporated into the collector by epitaxy in a perimeter trench (or recess) etched into the collector to better control the carbon profile and location. The carbon suppresses the out-diffusion of the collector implant dopants from the intrinsic device toward its perimeter, which results in a lower parasitic $C_{CB}$. The trench (or recess) is formed by etching portions of the collector using the trench isolation regions that helped to define the collector and a patterned layer over the center part of the collector as masks. Si:C is then grown using selective epitaxy inside the trench (or recess) to form a Si:C region with sharp and well-defined edges. The Si:C region is positioned next to each trench isolation region that was used to define the collector. The depth, width and C content can be optimized to control and tailor the collector implant diffusion and to reduce the perimeter component of parasitic $C_{CB}$.

The present invention relates to a semiconductor structure that can be used as a substrate for providing a high performance bipolar device. Specifically, the semiconductor structure of the present invention comprises a Si-containing substrate having a collector defined between adjacent trench isolation regions, said collector including an epitaxial Si:C region located in an upper surface thereof, said epitaxial Si:C region abutting each of said adjacent trench isolation regions, and a first conductivity type doping region in said collector located next to said epitaxial Si:C region.

The epitaxial Si:C region provides a perimeter that laterally surrounds the first conductivity type dopant region.

In addition to the semiconductor structure described above, the present invention also provides a method of fabricating the same. Specifically, and in broad terms, the method of the present invention comprises:

providing a recess in exposed portions of a collector, said recess is located adjacent to each trench isolation region that defines said collector; and filling said recess with Si:C utilizing a selective epitaxial growth process.

In one embodiment of the present invention, the collector is not doped with a first conductivity type dopant prior to providing the recess. In such an embodiment, the collector is subjected to a selective implant step after filling the recess with Si:C in which a first conductivity type dopant is incorporated into the collector in a region next to said Si:C.

In another embodiment of the present invention, the collector is partially or fully doped with a first conductivity type dopant prior to providing the recess. In the case in which the collector is fully doped, a selective implant into the collector after filling the recess with Si:C is not required. In the case in with the collector is partially doped, a selective implant into the collector can be performed after the recess has been filled with Si:C.

In accordance with the present invention, the recess forms a trench perimeter around a center portion of the collector. The recess can have vertical sidewalls or the sidewall of the recess not in contact with an adjoining trench isolation region can be tapered, i.e., sloped. Thus, a donut shaped region containing the epitaxial Si:C is formed. In the various embodiments of the present invention, the first conductivity type dopant, i.e., n-type or p-type, is located within the center portion of the collector. That is, the first conductivity type dopant will be located within a center portion of the collector, and it will be surrounded on each side by the epitaxial Si:C region. The presence of the Si:C region confines the dopants within the dopant region. Thus, the inventive method effectively suppresses the dopant diffusion that can cause the parasitic component of $C_{CB}$ to increase during processing.

The processing step described above can be incorporated into any conventional bipolar process flow so as to form a bipolar device onto the semiconductor structure containing the epitaxial Si:C region.

BRIEF DESCRIPTION OF THE DRAWINGS

FIG. 3 is a pictorial representation (through a cross sectional view) illustrating the structure of FIG. 2 after forming a hardmask over a portion of the structure.

FIG. 4 is a pictorial representation (through a cross sectional view) illustrating the structure of FIG. 3 after performing an etching step, which recesses portions of the collector.

DETAILED DESCRIPTION OF THE INVENTION

Figure 1:
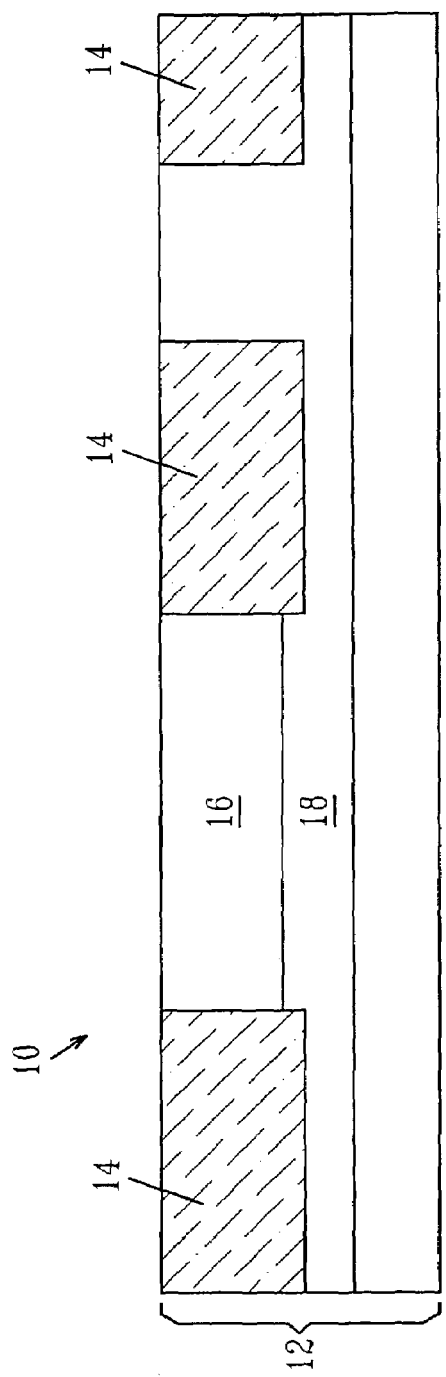
FIG. 1 is a pictorial representation (through a cross sectional view) illustrating an initial structure that can be used in the present invention.

The present invention, which provides a bipolar transistor with a collector having an epitaxial Si:C region and a method of fabricating the same, will now be described in greater detail by referring to the drawings that accompany the present application. The drawings are provided for illustrative purposes and thus they are not drawn to scale.

The inventive method of forming a bipolar device with a collector having an epitaxial Si:C region begins with first providing the initial structure 10 shown in FIG. 1. The initial structure 10 includes a Si-containing substrate 12 having trench isolation regions 14 formed therein. The Si-containing substrate includes any semiconductor material that includes silicon. Illustrative examples of such Si-containing semiconductor materials include, but are not limited to: Si, SiGe, silicon-on-insulator (SOI), or a silicon germanium-on-insulator (SGOI). Alternatively, the Si-containing substrate 12 may be a Si layer such as epitaxial Si or amorphous Si formed atop a semiconductor. The Si-containing substrate 12 may include various doping regions. Additionally, the Si-containing substrate 12 typically includes a collector 16 and a subcollector 18. The collector 16 can be undoped, partially doped or fully doped with a first conductivity type dopant at this point of the present invention. The predoped collector 16 can be formed by an in-situ doping process or by ion implantation and annealing.

The trench isolation regions 14 are formed using techniques well known to those skilled in the art including, for example, lithography, etching, optionally forming a trench liner, trench filling and planarization. The trench fill material includes a trench dielectric such as an oxide.

Next, a protective material 20, such as an oxide, nitride, oxynitride or multilayers thereof, is then formed atop the structure shown in FIG. 1. Typically, the protective material 20 is an oxide such as $SiO_2$. The protective material 20 is formed by a conventional deposition process such as chemical vapor deposition (CVD) or plasma-enhanced chemical vapor deposition. Alternatively, the protective material 20 is formed by oxidation, nitridation or oxynitridation. The thickness of the protective material 20 formed may vary depending on the type of material used as well as the technique that was used to deposit the same. Typically, the protective material 20 has a thickness from about 10 to about 25 nm.

Figure 2:
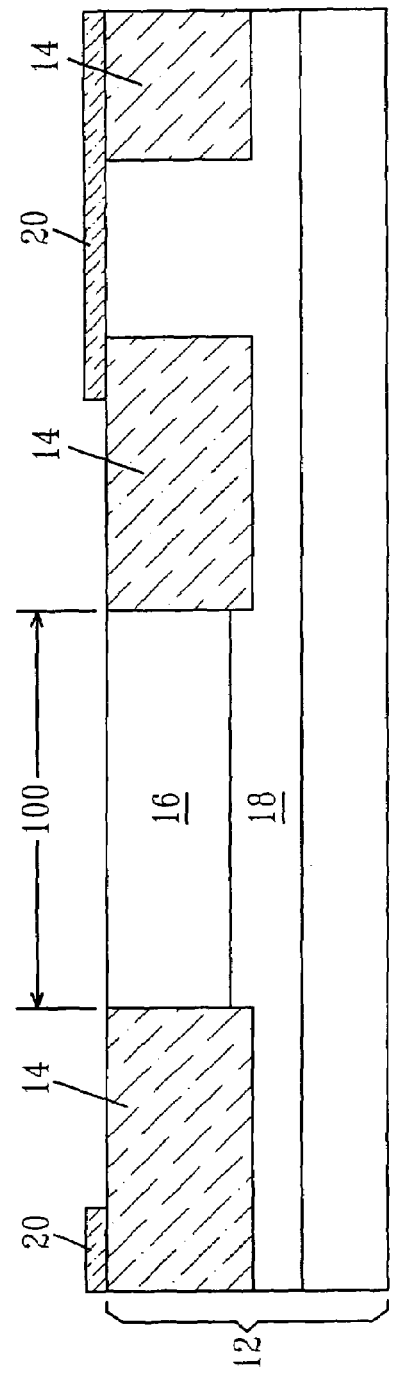
FIG. 2 is a pictorial representation (through a cross sectional view) illustrating the structure of FIG. 1 after forming a patterned protective material thereon.

A patterned photoresist mask having an opening that exposes the bipolar device area is then formed atop the protective material 20 and the protective material 20 is patterned to provide the structure shown in FIG. 2. As shown, the bipolar device area (labeled as 100 in the drawing) is exposed after the patterning step. The patterned photoresist mask is formed by deposition and lithography, while the patterning is performed utilizing a reactive-ion etching (RIE) process or another like dry etching process. A wet etching process is also contemplated herein.

Next, and as shown in FIG. 3, a patterned hardmask 22 is formed over an exposed portion of the bipolar device area 100. The patterned hardmask 22 may comprise an oxide, nitride, oxynitride or any multilayer thereof. Preferably, the patterned hardmask 22 is a nitride such as silicon nitride. The patterned hardmask 22 is formed by first depositing a hardmask material on the entire structure and thereafter the deposited hardmask material is patterned by lithography and etching. The etching process employed in this step of the present invention must be selective for removing hardmask material; thus it is preferred that the hardmask material and the protective material are composed of different dielectrics. The patterned hardmask 22 can have vertical sidewalls as shown, or the sidewalls of the patterned hardmask 22 can be slightly tapered.

After providing the patterned hardmask 22 to a portion of the exposed bipolar device area 100, the regions of the Si-containing substrate 12 including the collector 16 that are exposed are etched to provide a recess 24 in the structure. As shown in FIG. 4, recess 24 is formed adjacent to each of the trench isolation regions 14 that are used to define the bipolar device area 100. The recess 24 is formed utilizing a timed reactive-ion etching step using the patterned hardmask 22 and the trench isolation regions 14 as masks. The depth of the recess can vary, but typically it does not extend below the bottom surface of the trench isolation regions 14. The resultant structure including the recess 24 is shown in FIG. 4. The recess 24 forms a donut shaped perimeter around the center portion of the collector. The recess 24 can have vertical sidewalls, or the sidewall of the recess that is not in contact with the adjoining trench isolation region 14 can be tapered.

Figure 5:
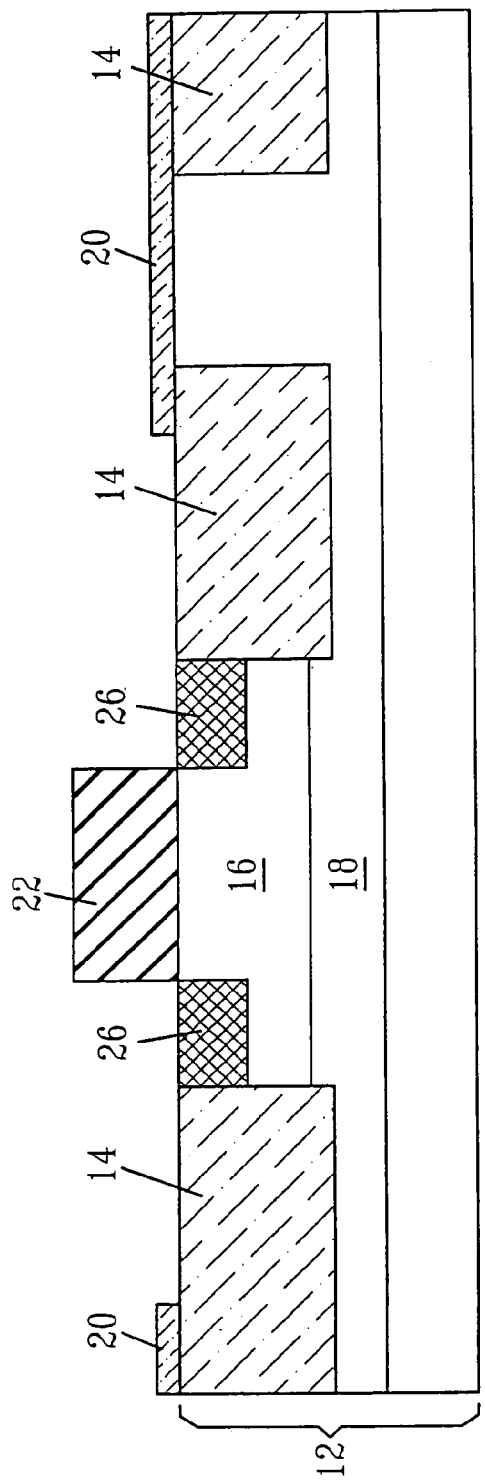
FIG. 5 is a pictorial representation (through a cross sectional view) illustrating the structure of FIG. 4 after growing an epitaxy Si:C layer in the recess portions that were previously formed into the collector.

Next, and as is shown in FIG. 5, Si:C is grown in the recess 24 utilizing a selective epitaxial growth process in which a carbon source and a silicon source are employed. In FIG. 5, reference numeral 26 denotes the epitaxial Si:C region that is formed in this step of the present invention. The filled recess 24 thus forms a selective epitaxial Si:C donut shaped region 26 around a center portion of the collector 16. The selective epitaxy of Si:C region 26 is performed utilizing any epitaxial growth process and is usually followed by thermal annealing to remove any defect caused by the recess etching and Si:C growth processes.

The C source and the Si source include those that are typically employed for forming a Si:C material. For example, a hydrocarbon can be used as the C source, while a silane can be used as the Si source. The selective epitaxy is typically performed at a temperature of about 800° C. or less, with a temperature from about 400° to about 500° C. being more typical.

The thermal anneal of the Si:C region 26 is performed at a temperature from about 600° to about 1200° C., with a temperature from about 1000° to about 1100° C. being more typical. The thermal anneal includes a rapid thermal anneal, a furnace anneal, a spike anneal, a laser anneal, a microwave anneal or any other type of annealing process that can generate heat.

It is noted that the depth, width and C content of the Si:C region 26 can be optimized to control and tailor the collector implant diffusion and to reduce the perimeter parasitic component of $C_{CB}$. Typically, the Si:C region 26 has a depth from about 150 to about 250 nm and a width from about 100 to about 250 nm. The C content within the Si:C region 26 is typically from about 0.02 to about 20 atomic %, with a C content from about 0.2 to about 10 atomic % being more typical.

The Si:C region 26 can have a uniform C content throughout the entire thickness thereof. Alternatively, the Si:C region 26 can have a graded C content which may vary throughout the entire thickness of the region. The graded Si:C layer may include a region containing zero atomic percent carbon.

Figure 6:
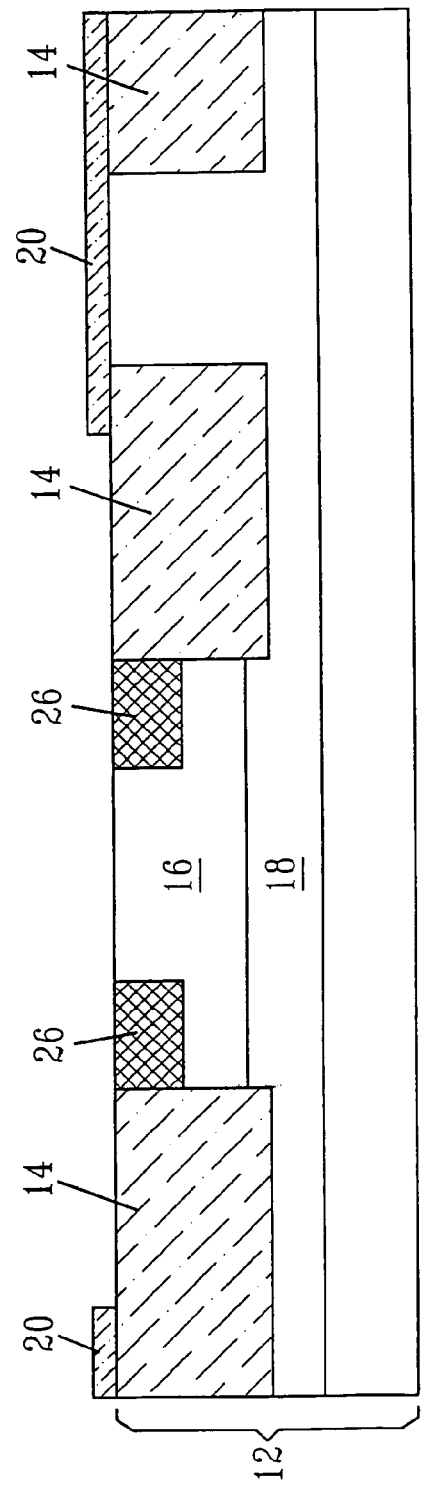
FIG. 6 is a pictorial representation (through a cross sectional view) illustrating the structure of FIG. 5 after removing the hardmask.

The patterned hardmask 22 is then removed from the structure utilizing an etching process that selectively removes hardmask material providing the structure shown in FIG. 6. In some embodiments, in which the collector 16 is fully pre-doped with a first conductivity type dopant, the bipolar device, as described below, can be formed on this structure.

Figure 7:
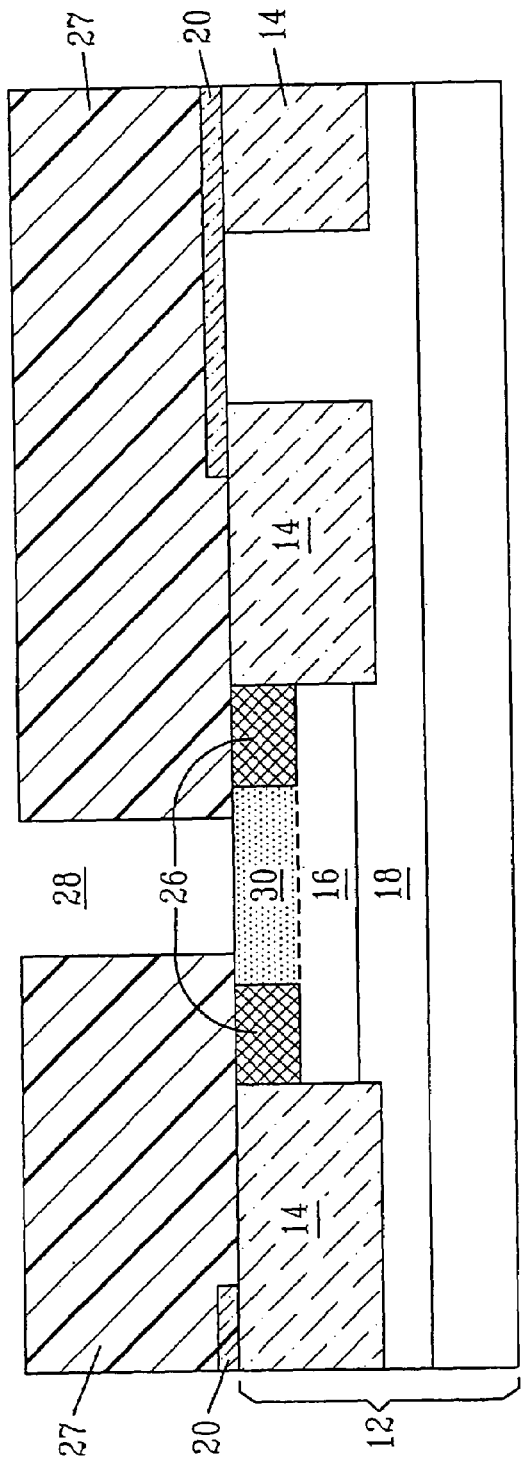
FIG. 7 is a pictorial representation (through a cross sectional view) illustrating the structure of FIG. 6 after a selective collector implant step.

In other embodiments, in which the collector 16 is undoped or partially doped, the following processing steps are typically employed: After removing the patterned hardmask 22, a patterned photoresist 27 having opening 28 is formed on the structure providing the patterned structure shown, for example, in FIG. 7. As shown, opening 28 exposes a portion of the collector 16 that is located between the selective epitaxy Si:C region 26. A selective collector ion implantation process is then performed in which either a p-type dopant (such as B, Al, Ga, In or Tl) or a n-type dopant (such as P, As or Sb) is incorporated into the collector 16 forming dopant region 30. Doping region 30 lies within the donut shaped Si:C perimeter 26. Preferably, this step of the present invention comprises the implantation of a n-type dopant into the collector 16.

After implanting the dopants selectively into the collector 16, the patterned photoresist 27 is removed from the structure utilizing a conventional stripping process that selectively removes the patterned photoresist 27 from the structure.

Figure 8:
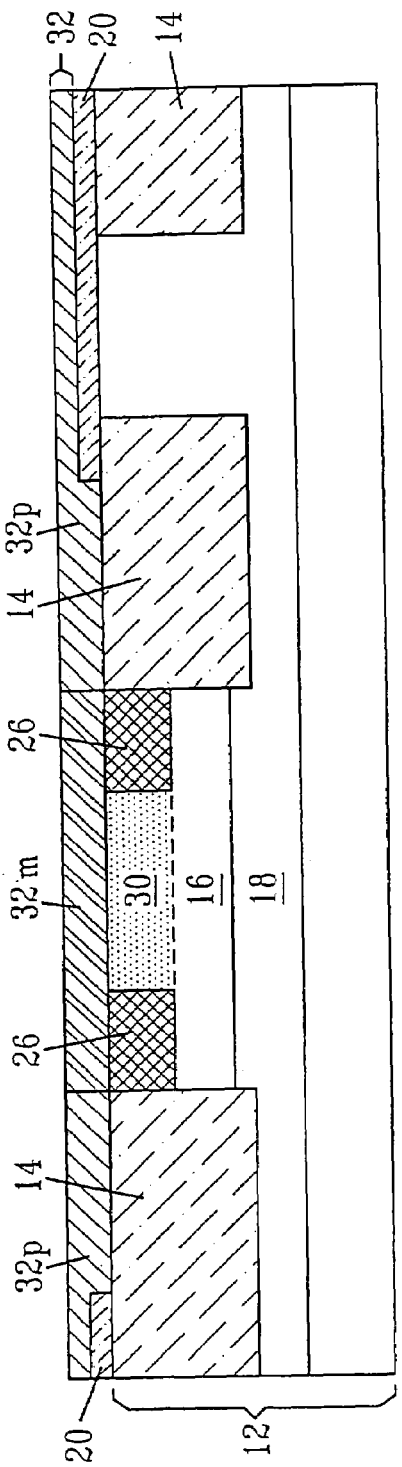
FIG. 8 is a pictorial representation (through a cross sectional view) illustrating the structure of FIG. 7 after growing the intrinsic base using a low temperature epitaxy process.

FIG. 8 shows the structure after the intrinsic base 32 is formed thereon. Intrinsic base 32 is formed by a low temperature epitaxial growth process (typically 450°-700° C.). The intrinsic base layer 32, which may comprise Si, SiGe or a combination of Si and SiGe, is monocrystalline 32m on top of exposed portions of the Si-containing substrate 12 and polycrystalline 32p on top of the trench isolation regions 14 and the protective film 20. The region in which polycrystalline changes over to monocrystalline is referred to as the facet region. The intrinsic base layer 32 that is formed at this step of the present invention typically has a thickness after epitaxial growth of from about 400 to about 6000 Å.

Figure 9:
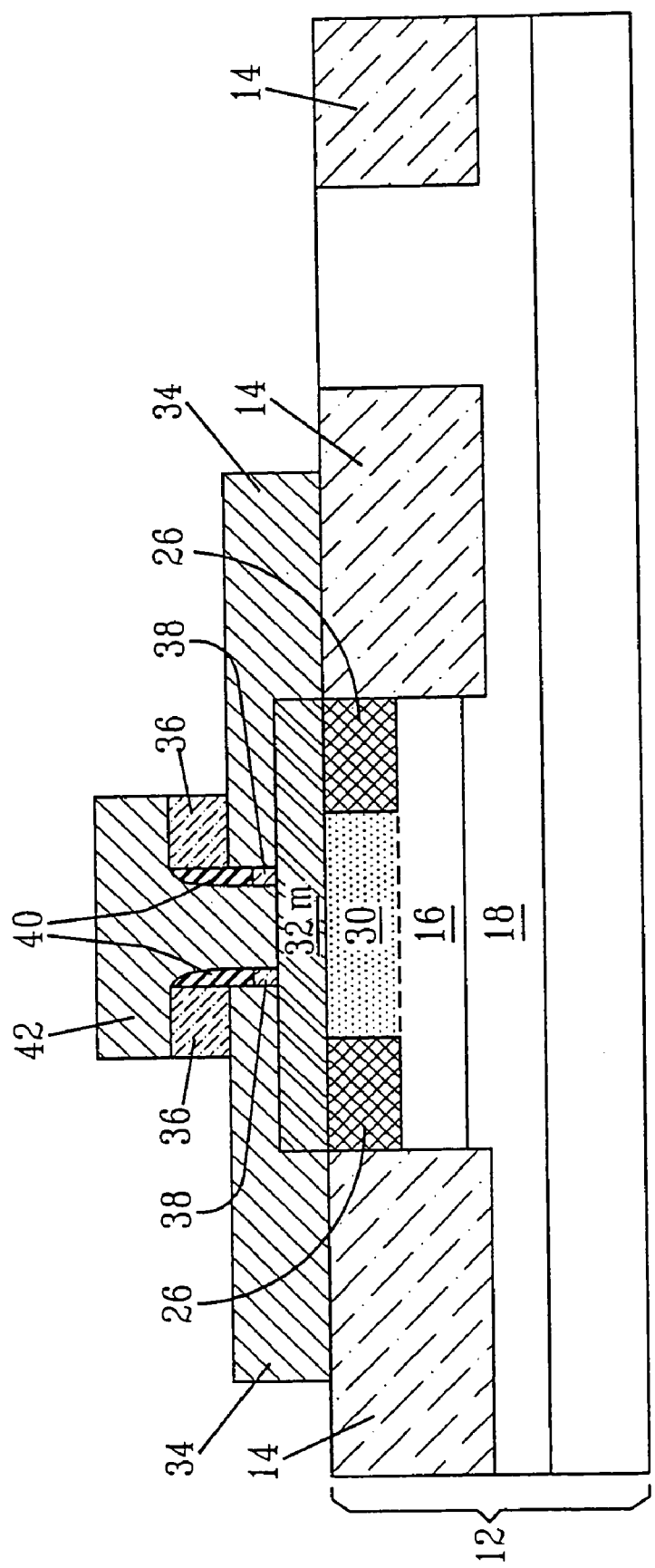
FIG. 9 is a pictorial representation (through a cross sectional view) illustrating the structure of FIG. 8 after raised extrinsic base and emitter formation.

FIG. 9 shows the final bipolar structure that is formed utilizing techniques known in the art. The final bipolar structure includes a raised extrinsic base 34 that is formed atop the monocrystalline region 32m as well as the polycrystalline region 32p. The raised extrinsic base 34 comprises the same or different semiconductor material as the intrinsic base layer 32. The structure also includes a patterned oxide layer 36 that is located above the raised extrinsic base 34. The patterned oxide layer 36 typically has a thickness from about 100 to about 200 nm, to provide sufficient emitter-base isolation. The patterned oxide layer 36 has an opening that exposes a portion of the monocrystalline region 32m of the intrinsic base layer 32.

As also shown in FIG. 9, an oxide layer 38 and insulating spacers 40 are located within the opening that is located in the patterned oxide 36. The resultant structure shown in FIG. 9 also includes a doped semiconducting layer 42 such as polysilicon, Si or SiGe (hereinafter doped layer 42). The doped layer 42 can be a layer with a variable doping concentration, or Ge composition that can be grown in a state-of-the-art low temperature epitaxy system. Note that doped layer 42 serves as the emitter of the bipolar device. In one preferred structure, the intrinsic base layer 32 is comprised of SiGe and doped layer 42 is comprised of polysilicon.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising the steps of:
   providing a recess in exposed portions of a collector, said recess is located adjacent to each trench isolation region that defines said collector; and
   filling said recess with Si:C utilizing a selective epitaxial growth process.

2. The method of claim 1 wherein said collector is fully doped with a first conductivity type dopant.

3. The method of claim 1 wherein said collector is undoped or partially doped with a first conductivity type dopant.

4. The method of claim 3 further comprising selectively implanting a first conductivity type dopant in said undoped or partially doped collector in a region next to said Si:C.

5. The method of claim 1 wherein said providing said recess includes forming vertical sidewalls or forming a sidewall that is tapered, said tapered sidewall is not in contact with said trench isolation region.

6. The method of claim 1 wherein said selective epitaxial growth process provides a uniform C content throughout the region or a graded C content.

7. The method of claim 1 further comprising a thermal anneal step, said thermal anneal step is performed after said filling said recess with Si:C.

8. The method of claim 4 wherein said selectively implanting a first conductivity type dopant includes forming a patterned photoresist mask over said collector, wherein said patterned photoresist mask protects said collector containing said Si:C.

9. The method of claim 1 wherein said recess has a depth from about 150 to about 250 nm and a width from about 100 to about 250 nm.

10. The method of claim 1 wherein said Si:C has a carbon content from about 0.02 to about 20 atomic percent.

11. The method of claim 1 wherein said recess containing said Si:C forms a perimeter that laterally surrounds a first conductivity type dopant region located in said collector.

12. The method of claim 1 further comprising forming a bipolar device over said collector.

* * * * *